(12) United States Patent
Gau

(10) Patent No.: US 6,949,440 B2
(45) Date of Patent: Sep. 27, 2005

(54) METHOD OF FORMING A VARACTOR

(75) Inventor: Jing-Horng Gau, Hsin-Chu Hsien (TW)

(73) Assignee: United Microelectronics Corp., Hsin-Chu (TW)

(*) Notice: Subject to any disclaimer, the term of this patent is extended or adjusted under 35 U.S.C. 154(b) by 38 days.

(21) Appl. No.: 10/605,972

(22) Filed: Nov. 11, 2003

(65) Prior Publication Data
US 2005/0101098 A1 May 12, 2005

(51) Int. Cl.⁷ .............................................. H01L 21/20
(52) U.S. Cl. ........................ 438/379; 438/238; 438/473
(58) Field of Search ................................ 438/379, 238, 438/473, 237; 257/312, 313, 595

(56) References Cited

U.S. PATENT DOCUMENTS

| | | | |
|---|---|---|---|
| 5,965,912 A | * 10/1999 | Stolfa et al. | ........ 257/312 |
| 6,608,362 B1 | * 8/2003 | Kai et al. | ........ 257/528 |
| 6,720,637 B2 | * 4/2004 | Voldman | ........ 257/473 |
| 6,825,546 B1 | * 11/2004 | Walker et al. | ........ 257/596 |

* cited by examiner

Primary Examiner—Alexander Ghyka
(74) Attorney, Agent, or Firm—Winston Hsu

(57) ABSTRACT

A method of forming a varactor includes forming an ion well of a first conductivity type on a substrate and a plurality of isolation structures on the ion well. The isolation structures define at least an active area on the ion well. Following that, ions of the first conductivity type are implanted into the ion well to form a doping region within the active area. A doping layer of a second conductivity type is then formed on the substrate to cover portions of the doping region. A salicide layer is formed on the doping region and the doping layer.

16 Claims, 15 Drawing Sheets

METHOD OF FORMING A VARACTOR

BACKGROUND OF INVENTION

1. Field of the Invention

The present invention relates to a method of forming a varactor, and more particularly, to a method of forming a varactor having a PN junction.

2. Description of the Prior Art

In modern information business, all kinds of data, information, video, and so on are all transmitted electronically. A processing circuit for dealing with electronic signals thus becomes the most important foundation of modern information business. For example, in common information systems (such as a personal computer), a global clock is required to coordinate all digital circuits in the systems, so an oscillator for generating clock is an indispensable circuit block for modern digital circuits. In addition, to synchronize circuits with different clocks, phase loop lock (PLL) circuits are needed, and a precise voltage-controlled oscillator (VCO) is essential for the PLL to generate different frequencies of signals. Furthermore, in some precise filters, resistor-capacitor (RC) filters, in which filter frequency can be adjusted, are utilized frequently.

With filter characteristics of an RC filter and oscillation characteristics of an inductor-capacitor (LC) oscillator, it is possible to adjust each of them by modifying the capacitance value. Numerous varactors have been developed and are successfully employed in integrated circuits to provide variable capacitance values. For example, it is known to employ PN diodes, Schottky diodes or metal-oxide semiconductor (MOS) diodes as a varactor in bipolar junction transistors (BJTs), complementary metal-oxide semiconductor (CMOS) transistors and BiCMOS transistors.

Referring to FIG. 1, FIG. 1 is a cross-sectional diagram of a PN diode varactor according to the prior art. As shown in FIG. 1, a substrate 10 includes an N-type ion well 12, and a plurality of isolation structures 14, such as field oxide layer or shallow trench isolation, on surfaces of the N-type ion well 12 and the substrate 10. The isolation structures 14 define a plurality of predetermined regions on the N-type ion well 12 to form at least an N-type doping region 16 and a P-type doping region 18, thus completing a diode structure having a PN junction. When the diode is reverse-biased, a depletion region occurs in the PN junction of the diode and acts as a dielectric, so that the N-type doping region 16 and the P-type doping region 18 separated by the dielectric form an equivalent capacitor. With an adjustment in the voltage across the anode (the P-type doping region 18) and the cathode (the N-type doping region 16) of the diode, a width of the depletion region varies to change the equivalent capacitance of the varactor.

At least a mask is usually needed in the prior art method to define the positions of the N-type doping region 16 and the P-type doping region 18, so that different conductivity types of dopants can be used to adjust the doping concentrations of the N-type doping region 16 and the P-type doping region 18 to improve a quality factor of the varactor. A distance between the anode and the cathode of the varactor spans the P-type doping region 18, the N-type ion well 12 and the N-type doping region 16. Since the doping concentration of the N-type ion well 12 is not high, the resistance between the anode and the cathode of the varactor is increased to affect its electrical performance. In order to develop varactors having higher qualities to be employed in IC elements such as oscillators and filters, it is an important issue for the industry to improve the tunability, the quality factor, and the capacitance-voltage linearity of the varactors without increasing the complexity of the manufacturing process thereof.

SUMMARY OF INVENTION

It is therefore an object of the claimed invention to provide a method of forming a varactor to improve the electrical performance thereof.

According to the claimed invention, an ion well of a first conductivity type is formed on a substrate and a plurality of isolation structures are formed on the ion well. The isolation structures define at least an active area on the ion well. Following that, ions of the first conductivity type are implanted into the ion well to form a doping region within the active area. A doping layer of a second conductivity type is then formed on the substrate to cover portions of the doping region. A salicide layer is formed on the doping region and the doping layer.

It is an advantage of the present invention that the doping region of the first conductivity type and the doping layer of the second conductivity positioned above the doping region form a PN junction of the varactor. Therefore, it is not necessary for the present invention to use an extra mask to define the positions of the doping region and the doping layer, and to perform the doping processes of the doping region and the doping layer with the extra mask. In this case, at least a mask and its corresponding doping processes can be saved in the present invention, and a distance between the anode and the cathode of the varactor can be effectively shortened to improve the quality factor and the electrical performance according to the present invention. In addition, the present invention may further adjust the doping concentration of the doping region to be higher than the doping concentration of the ion well. In this case, a depletion region occurred in the PN junction is expanded from the surface of the doping region with the higher doping concentration toward the underneath ion well with the lower doping concentration, thus providing better capacitance-voltage linearity and higher tunability.

These and other objects of the claimed invention will be apparent to those of ordinary skill in the art after reading the following detailed description of the preferred embodiment that is illustrated in the various figures and drawings.

DETAILED DESCRIPTION

Figure 1:
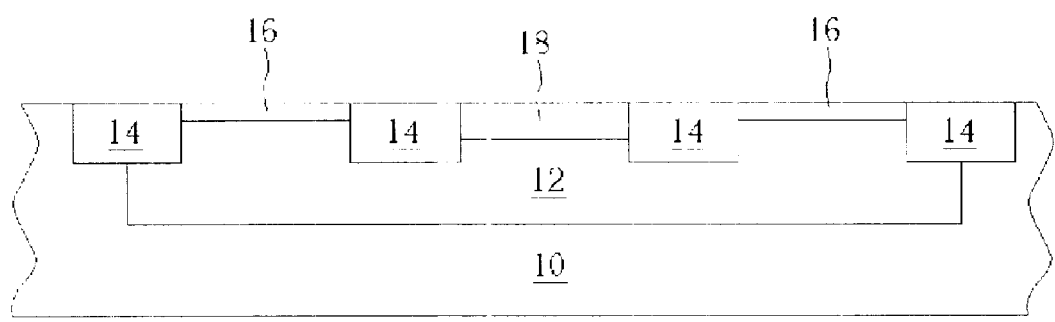
FIG. 1 is a cross-sectional diagram of a varactor according to the prior art.
Figure 2:
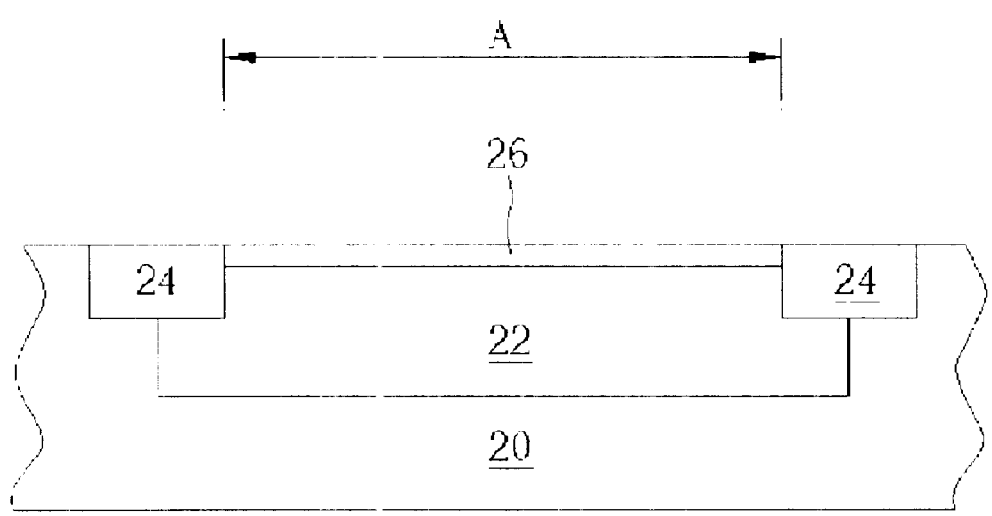
FIGS. 2–5 are schematic diagrams of a method of forming a varactor according to the present invention.

Referring to FIGS. 2–5, FIGS. 2–5 are schematic diagrams of a method of forming a varactor according to the present invention. As shown in FIG. 2, a substrate 20 is provided. The substrate 20 includes an N-type ion well 22, and a plurality of isolation structures 24, such as field oxide layer or shallow trench isolation, positioned on surfaces of the N-type ion well 22 and the substrate 20. The isolation structures 24 define at least an active area A for forming an anode and a cathode of the varactor on the ion well 22. Following that, dopants with the same conductivity type as the ion well 22 are used to form an N-type doping region 26 within the active area A, the N-type doping region 26 being used as a bottom electrode (cathode) of the varactor. In a better embodiment of the present invention, the substrate 20 further includes at least a buried N-type doping region (not shown) positioned below the ion well 22 to lower the resistance of the doping region 26 and the ion well 22. In addition, a doping concentration of the doping region 26 is suggested to be higher than a doping concentration of the ion well 22. For example, processes of forming the varactor can be combined with processes of forming a CMOS transistor according to the present invention. In this case, a doping process can be used to form the doping region 26 together with a lightly doped drain of an NMOS transistor, and another doping process can be used to form the N-type ion well 22 together with an N-type ion well of a PMOS transistor. In other embodiments of the present invention, the ion well 22 can be a P-type ion well, and the doping region 26 can be a P-type doping region, too.

Figure 3:
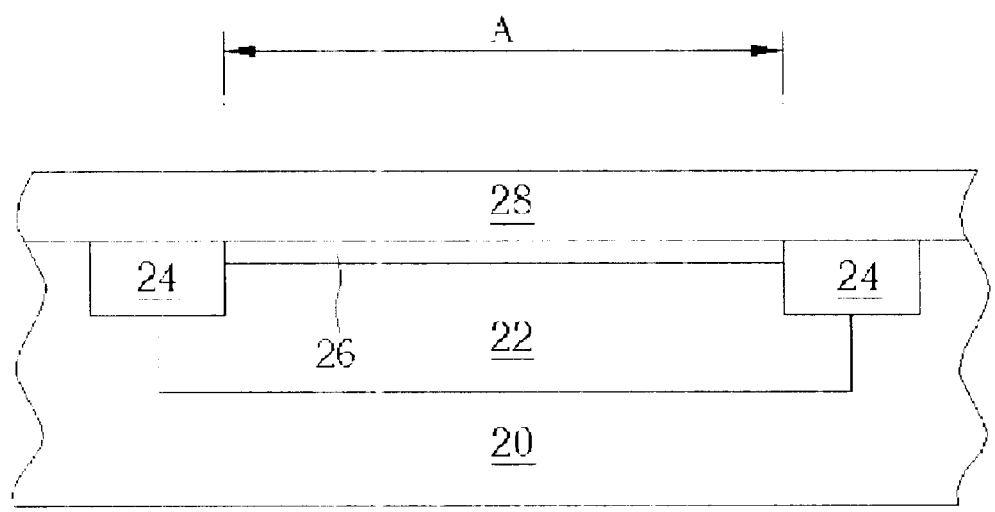

As shown in FIG. 3, a deposition process is then performed followed by a doping process, thus forming a doping layer 28 of a conductivity type different from the conductivity types of the ion well 22 and the doping region 26 on the substrate 20. The doping layer 28 is used as a top electrode (anode) of the varactor. In a better embodiment of the present invention, the ion well 22 and the doping region 26 are N-type doping regions, the doping layer 28 is a P-type doping layer, such as a P-type epitaxial layer made of silicon, silicon germanium, or a composite of silicon and silicon germanium with a thickness of about 1000–1500 angstroms, or the doping layer 28 can also be a doped P-type polysilicon layer with a thickness of about 2000–3000 angstroms. In other embodiments of the present invention, the ion well 22 and the doping region 26 can be P-type doping regions, the doping layer 28 is an N-type doping layer, such as an N-type epitaxial layer made of silicon, silicon germanium, or a composite of silicon and silicon germanium, or the doping layer 28 can also be a doped N-type polysilicon layer.

Figure 4:
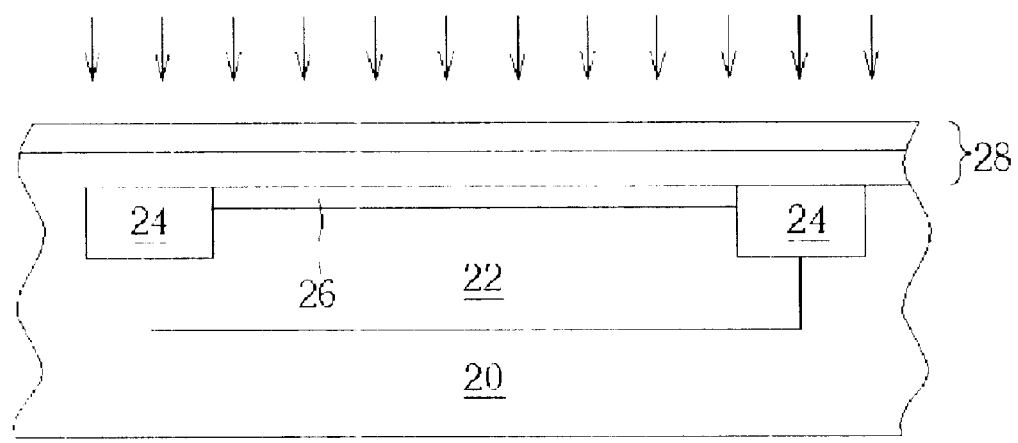
Figure 5:
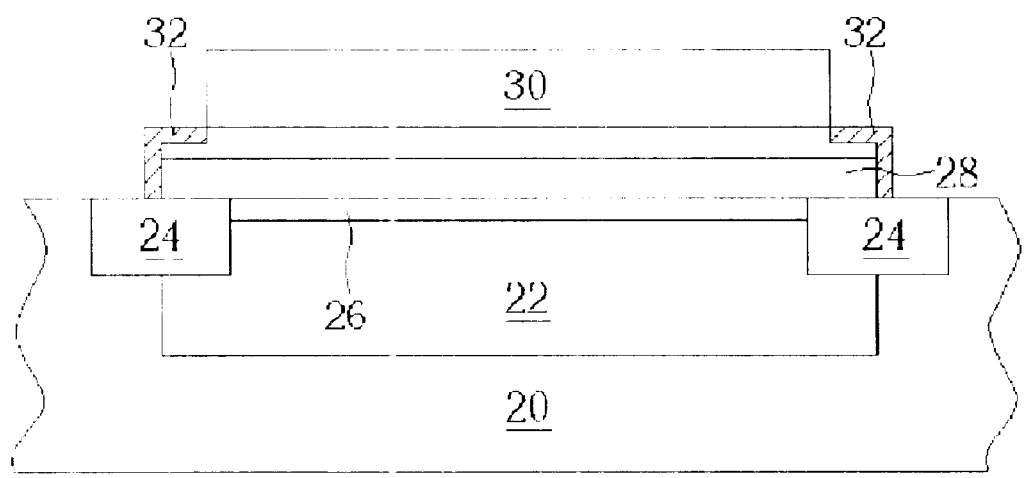
Figure 6:
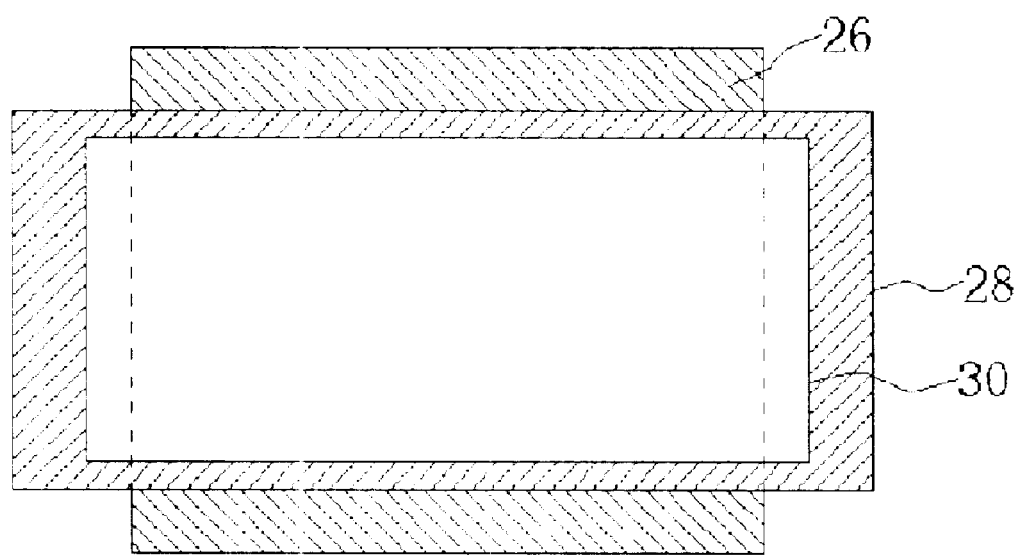
FIG. 6 is a top view of a varactor according to the present invention.

As shown in FIG. 4, an ion implantation process is performed to implant P-type ions (or N-type ions) into the doping layer 28 to adjust the resistance of the doping layer 28. As shown in FIG. 5, a salicide block (SAB) 30 is formed to cover portions of the doping layer 28 atop the doping region 26, thus preventing the PN junction between the doping layer 28 and the doping region 26 from being destroyed in a subsequent salicidation process. Following that, a photolithographic process and an etching process are selectively performed to remove portions of the doping layer 28 and define the pattern of the doping layer 28. Finally, a salicide layer 32 is formed on surfaces of the doping layer 28 and the doping region 26 to reduce the contact resistance of the anode and the cathode of the varactor, thus completing the fabrication of the varactor. As shown in FIG. 6, a top view of the varactor indicates that the doping layer 28 partially covers the doping region 26, so as to reserve the space for forming the salicide layer (the regions marked oblique lines) to connect with other wires.

Figure 7:
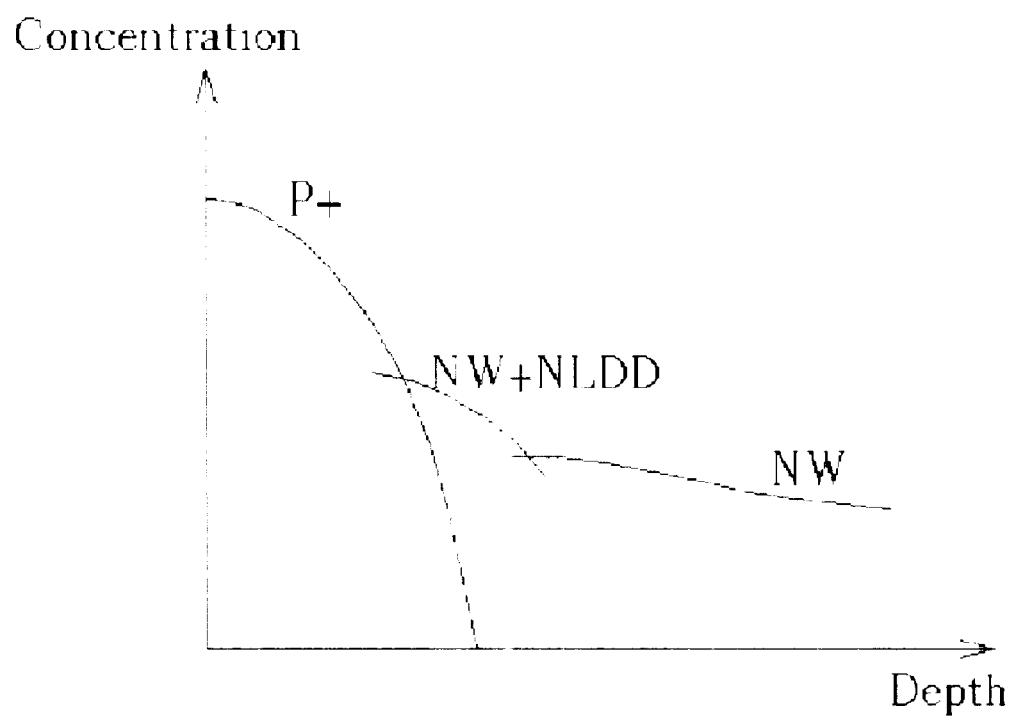
FIG. 7 is a correlation diagram between a depth and a doping concentration of a varactor according to the present invention.

Referring to FIG. 7, FIG. 7 is a correlation diagram between a depth and a doping concentration of a varactor according to the present invention. As shown in FIG. 7, the varactor has a higher doping concentration at the PN junction between the P-type doping layer (P+) and the N-type doping region (NW+NLDD) to obtain a higher capacitance per unit area. The capacitance per unit area of the varactor depends inversely on a width of the depletion region. When increasing the voltage supplied to the varactor, the width of the depletion region increases to expand the depletion region toward the N-type ion well (NW) having the lower doping concentration to obtain a lower capacitance per unit area. Therefore, the varactor of the present invention provides better capacitance-voltage linearity and higher tunability.

Figure 8:
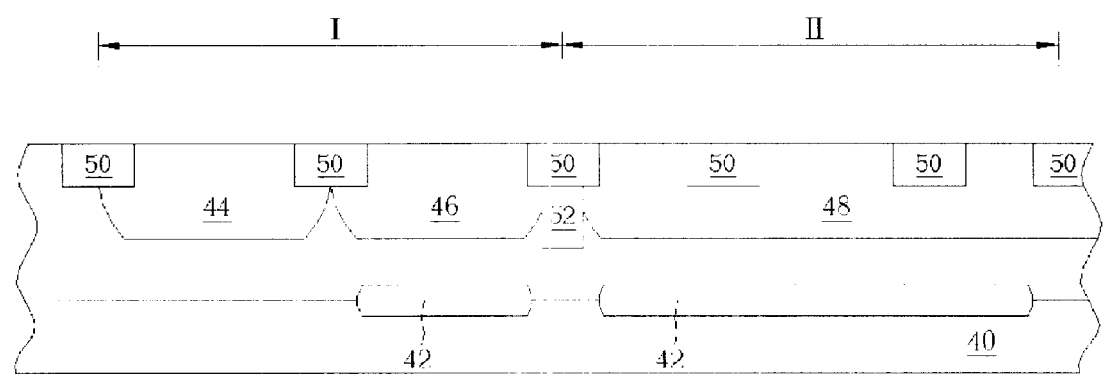
FIGS. 8–15 are schematic diagrams of a method of forming a CMOS transistor and a varactor according to the present invention.

Referring to FIGS. 8–15, FIGS. 8–15 are schematic diagrams of a method of forming a CMOS transistor and a varactor according to the present invention. In a better embodiment of the present invention, the varactor is formed using a BiCMOS process to achieve the advantages of improving the electrical performance of the varactor without increasing extra masks or processing steps to the BiCMOS process. As shown in FIG. 8, a substrate 40 is provided. The substrate 40 includes a CMOS region I for forming at least a CMOS transistor, and a varactor region II for forming at least a varactor. In addition, the substrate 40 may further include a BJT region (not shown) for forming at least a BJT. Subsequently, N-type dopants are implanted into the substrate 40 to form a plurality of buried N-type doping regions 42 within the substrate 40. P-type dopants and N-type dopants are then implanted into the substrate 40, respectively, to form at least a P-type ion well 44 in the CMOS region I, at least an N-type ion well 46 in the CMOS region I, and at least an N-type ion well 48 in the varactor region II.

A plurality of isolation structures 50, such as field oxide layer or shallow trench isolation, are formed on the substrate 40, thus defining an NMOS region on the P-type ion well 44, a PMOS region on the N-type ion well 46, and an active area for forming an anode and a cathode of the varactor on the N-type ion well 48. Following that, an ion implantation process is performed to form a buried P-type doping region 52 between the N-type ion wells 46 and 48 to prevent leakage currents between the CMOS transistor and the varactor.

Figure 9:
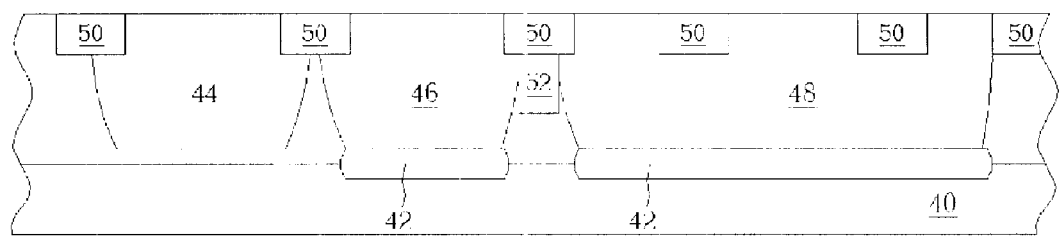

As shown in FIG. 9, a thermal treatment is used to drive in ions of the N-type ion wells 46 and 48 to the buried N-type doping regions 42. In other embodiments of the present invention, another ion implantation process is selectively performed to form at least an N-type doping region (not shown) in the N-type ion well 48 to connect with the underneath buried N-type doping region 42, functioning as a contact region of a bottom electrode of the varactor. However, the present invention may change layout designs of the varactor, for example use the top electrode to partially cover the bottom electrode (as shown in the top view FIG. 6 of the varactor). As a result, the bottom electrode of the varactor may reserve the space for forming the contact plug (salicide layer) to save the ion implantation process for forming the N-type doping regions as the contact region as mentioned above.

Figure 10:
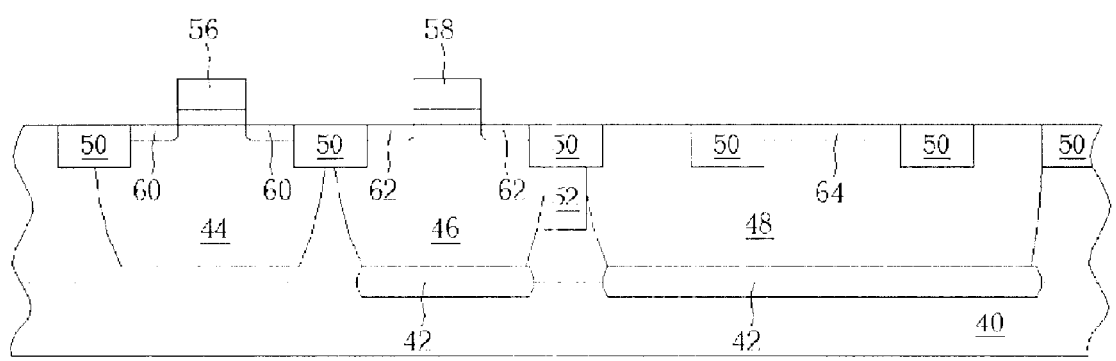
Figure 11:
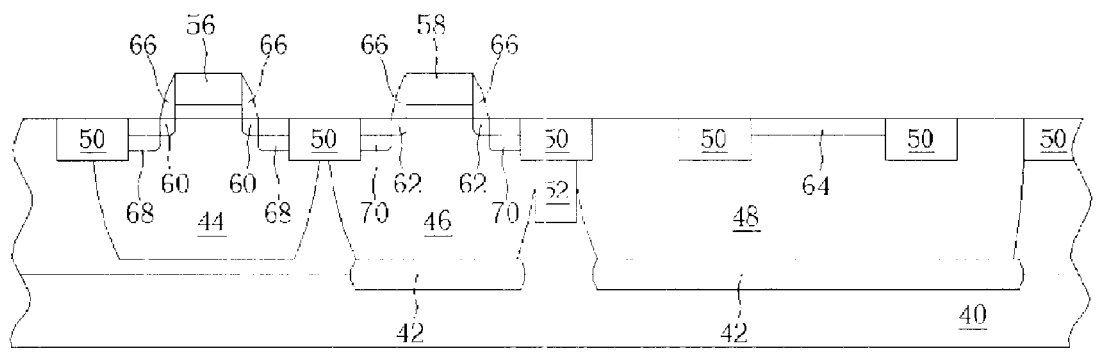

As shown in FIG. 10, a gate 56 and a gate 58 are formed on surfaces of the ion wells 44 and 46, respectively. N-type dopants are then used to form two N-type lightly doped drains 60 on the P-type ion well 44 and an N-type doping region 64 on the N-type ion well 48. In a better embodiment of the present invention, the doping region 64 is used as the bottom electrode of the varactor, and a doping concentration of the doping region 64 is higher than a doping concentration of the ion well 48. Subsequently, P-type dopants are used to form two P-type lightly doped drains 62 on the N-type ion well 46. As shown in FIG. 11, a spacer 66 is formed on both sides of the gate 56 and on both sides of the gate 58 followed by using N-type dopants to form two N-type source/drain regions 68 on the P-type ion well 44, and using P-type dopants to form two P-type source/drain regions 70 on the N-type ion well 46, thus completing the fabrication of the CMOS transistor.

Figure 12:
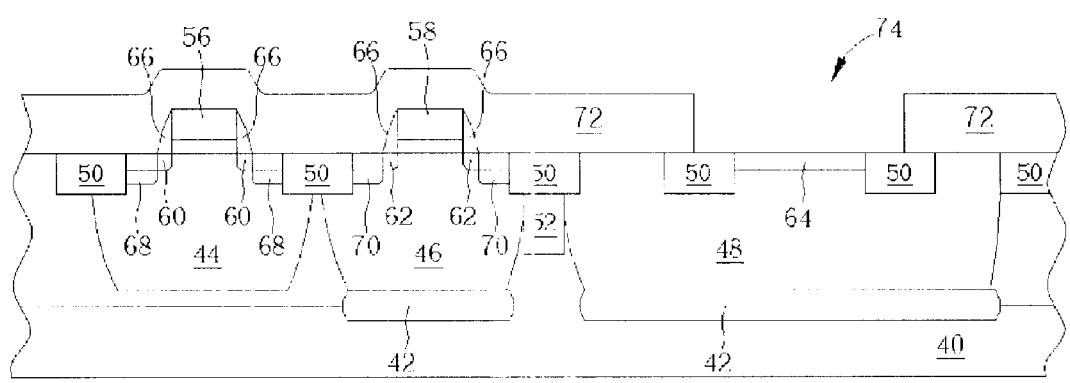

As shown in FIG. 12, a protective layer 72 is formed on the substrate 40 and the protective layer 72 includes an opening 74 to expose the doping region 64. The protective layer 72 is used to cover the CMOS transistor to facilitate the fabrication of the top electrode of the varactor on the doping region 64. The protective layer 72 can be an oxide layer, a silicon nitride layer, or a composite layer composed of oxide, silicon nitride and other dielectric materials.

Figure 13:
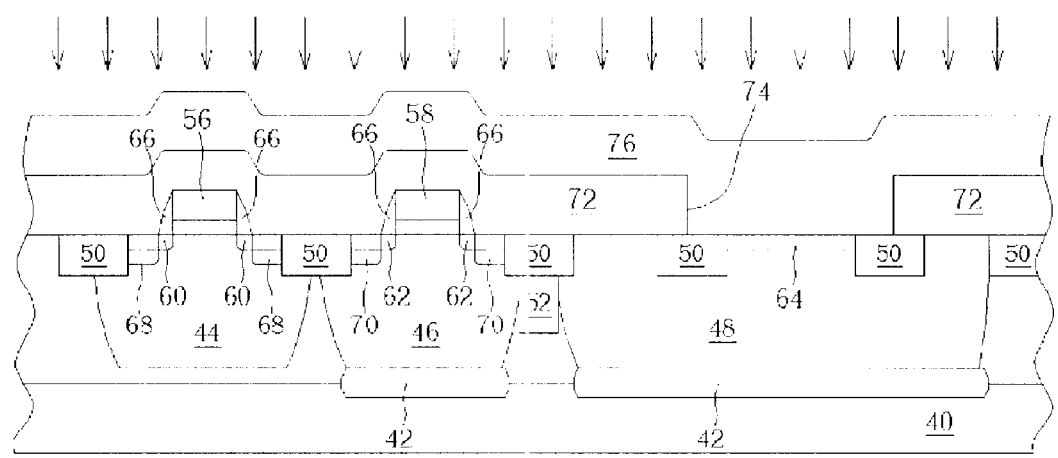

As shown in FIG. 13, a deposition process and an in-situ doping process are performed to form a doping layer 76 having different conductivity type from the conductivity types of the ion well 48 and the doping region 64. The doping layer 76 is used as the top electrode (anode) of the varactor to produce a PN junction between the doping layer 76 and the doping region 64. In a better embodiment of the present invention, the ion well 48 and the doping region 64 are N-type doping regions, the doping layer 76 is a P-type doping layer, such as a P-type epitaxial layer made of silicon, silicon germanium, or a composite of silicon and silicon germanium with a thickness of about 1000–1500 angstroms, or the doping layer 76 can also be a doped P-type polysilicon layer with a thickness of about 2000–3000 angstroms. In other embodiments of the present invention, the ion well 48 and the doping region 64 can be P-type doping regions, the doping layer 76 is an N-type doping layer, such as an N-type epitaxial layer made of silicon, silicon germanium, or a composite of silicon and silicon germanium, or the doping layer 76 can also be a doped N-type polysilicon layer.

Figure 14:
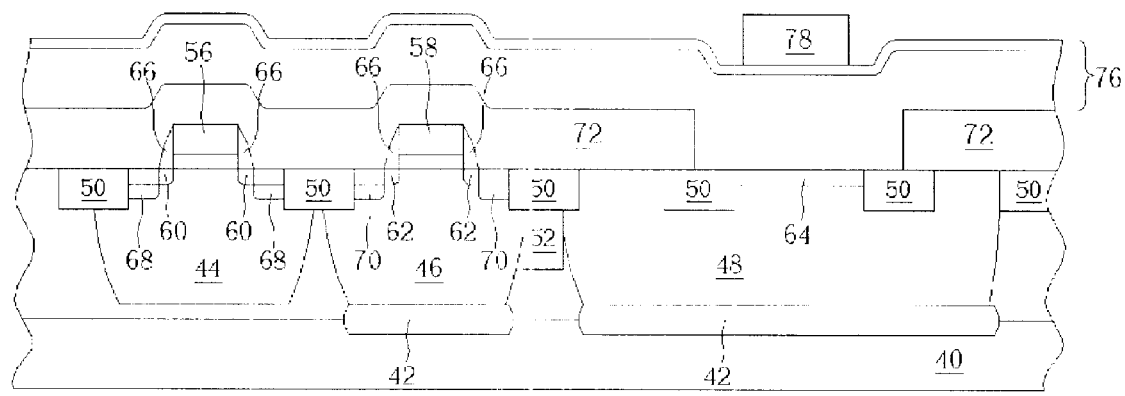
Figure 15:
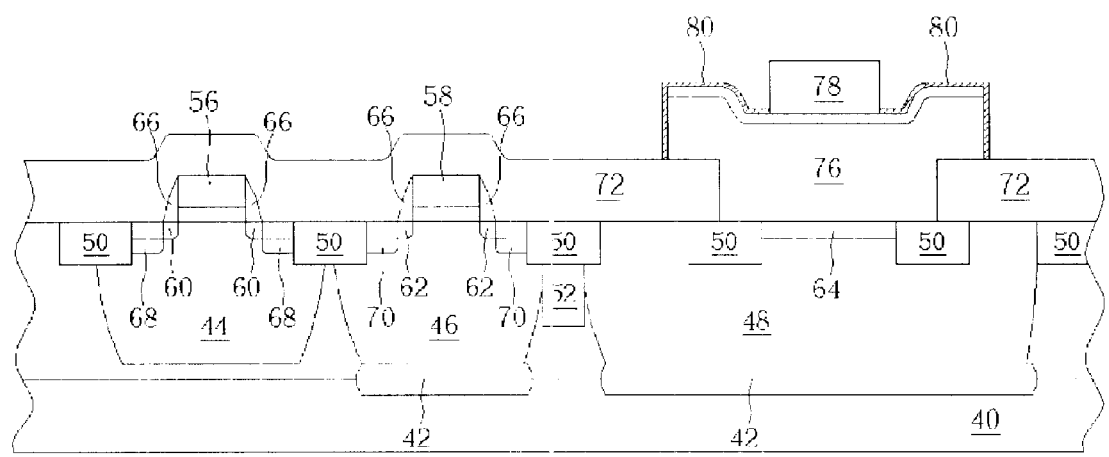

Subsequently, an ion implantation process is performed to implant P-type ions (or N-type ions) into the doping layer 76 to adjust the resistance of the doping layer 76. As shown in FIG. 14, a salicide block 78 is formed to cover portions of the doping layer 76 atop the doping region 64, thus preventing the PN junction between the doping layer 76 and the doping region 64 from being destroyed in a subsequent salicidation process. Following that, as shown in FIG. 15, a photolithographic process and an etching process are selectively performed to remove portions of the doping layer 76 and define the pattern of the doping layer 76. Finally, a salicide layer 80 is formed on surfaces of the doping layer 76 and the doping region 64 to reduce the contact resistance of the anode and the cathode of the varactor, thus completing the fabrication of the varactor.

In contrast to the prior art method of forming the varactor, the present invention uses the doping region (bottom electrode) positioned within the substrate and the doping layer (top electrode) positioned above the doping region to form the PN junction of the varactor. Therefore, it is not necessary for the present invention to use an extra mask to define the positions of the doping region and the doping layer, and to perform the doping processes of the doping region and the doping layer with the extra mask. In this case, at least a mask and its corresponding doping processes can be saved in the present invention, and a distance between the anode and the cathode of the varactor can be effectively shortened to improve the quality factor and the electrical performance according to the present invention. In addition, the present invention may further adjust the doping concentration of the doping region to be higher than the doping concentration of the underneath ion well. In this case, a depletion region occurred in the PN junction is expanded from the surface of the doping region with the higher doping concentration toward the ion well with the lower doping concentration, thus providing better capacitance-voltage linearity and higher tunability.

Those skilled in the art will readily observe that numerous modifications and alterations of the method may be made while retaining the teachings of the invention. Accordingly, the above disclosure should be construed as limited only by the metes and bounds of the appended claims.

What is claimed is:

1. A method of forming a P-N junction varactor, the method comprising:

providing a substrate, the substrate comprising an ion well of a first conductivity type and a plurality of isolation structures positioned on the ion well, the isolation structures defining at least an active area on the ion well;

implanting ions of the first conductivity type into the ion well to form a first electrode of the P-N junction varactor in the active area, and the first electrode being adjacent to the isolation structures;

forming a second electrode of the P-N junction varactor of a second conductivity type on the substrate to cover portions of the doping region, the second electrode being a doping layer; and forming a salicide layer on the first electrode and the second electrode.

2. The method of claim 1 further comprising forming a salicide block on the second electrode to prevent a junction between the first electrode and the second electrode from being destroyed by the salicide layer.

3. The method of claim 1 wherein the substrate comprises at least a buried doping region of the first conductivity type positioned beneath the ion well.

4. The method of claim 1 wherein the substrate comprises at least a CMOS transistor, and the doping region of the varactor and a lightly doped drain of the CMOS transistor are formed using the same doping process.

5. The method of claim 4 wherein before forming the second electrode, the method further comprises forming at least a protective layer on the substrate to cover the CMOS transistor.

6. The method of claim 1 wherein the second electrode comprises an epitaxial layer.

7. The method of claim 1 wherein the second electrode comprises a polysilicon layer.

8. The method of claim 1 further comprising an ion implantation process to implant ions of the second conductivity type into the second electrode to adjust the resistance of the second electrode.

9. The method of claim 1 wherein a doping concentration of the first electrode is higher than a doping concentration of the ion well.

10. A method of forming at least a CMOS transistor and at least a varactor on a substrate, the substrate comprising a first region for forming the CMOS transistor and a second region for forming the varactor, the method comprising:

implanting ions of a first conductivity type into the substrate to form at least a first ion well in the first region and at least a second ion welt in the second region;

implanting ions of a second conductivity type into the substrate to form at least a third ion well in the first region;

forming a plurality of isolation structures on the substrate;

forming a first gate on the first ion well and a second gate on the third ion well;

implanting ions of the first conductivity type into the substrate to form two first lightly doped drains on the third ion well, and simultaneously form a doping region on the second ion well;

implanting ions of the second conductivity type into the substrate to form two second lightly doped drains on the first ion well;

forming a spacer on both sides of the first gate and on both sides of the second gate;

forming two first source/drain regions of the second conductivity type on the first ion well, and forming two second source/drain regions of the first conductivity type on the third ion well;

forming a protective layer on the substrate, the protective layer comprising an opening to expose the doping region;

forming a doping layer of the second conductivity type on doping region; and performing a salicidation process to form a salicide layer on the substrate.

11. The method of claim 10 further comprising forming a salicide block on the doping layer to prevent a junction between the doping region and the doping layer from being destroyed by the salicide layer.

12. The method of claim 10 further comprising forming at least a buried doping region of the first conductivity type beneath the first ion well and the second ion well.

13. The method of claim 10 wherein the doping layer comprises an epitaxial layer.

14. The method of claim 10 wherein the doping layer comprises a polysilicon layer.

15. The method of claim 10 further comprising an ion implantation process to implant ions of the second conductivity type into the doping layer to adjust the resistance of the doping layer.

16. The method of claim 10 wherein a doping concentration of the doping region is higher than a doping concentration of the second ion well.

* * * * *